United States Patent
Doris et al.

(10) Patent No.: US 11,152,563 B2
(45) Date of Patent: Oct. 19, 2021

(54) REINFORCED SINGLE ELEMENT BOTTOM ELECTRODE FOR MTJ-CONTAINING DEVICES

(71) Applicant: International Business Machines Corporation, Armonk, NY (US)

(72) Inventors: Bruce B. Doris, Slingerlands, NY (US); Eileen A. Galligan, Fishkill, NY (US); Nathan P. Marchack, New York, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 16/555,527

(22) Filed: Aug. 29, 2019

(65) Prior Publication Data

US 2021/0066581 A1    Mar. 4, 2021

(51) Int. Cl.
  *H01L 43/12*  (2006.01)
  *H01L 41/47*  (2013.01)
  *H01L 43/02*  (2006.01)
  *H01L 27/22*  (2006.01)
  *H01L 43/08*  (2006.01)
  *H01L 45/00*  (2006.01)

(52) U.S. Cl.
  CPC .......... *H01L 43/12* (2013.01); *H01L 27/222* (2013.01); *H01L 41/47* (2013.01); *H01L 43/02* (2013.01); *H01L 43/08* (2013.01); *H01L 45/08* (2013.01); *G11C 2211/5615* (2013.01)

(58) Field of Classification Search
  CPC ......... H01L 43/12; H01L 43/08; H01L 45/08; H01L 27/222; H01L 41/47; H01L 43/02; G11C 2211/5615
  See application file for complete search history.

(56) References Cited

U.S. PATENT DOCUMENTS

| 8,802,451 B2 | 8/2014 | Malmhall et al. |
| 8,969,983 B2 | 3/2015 | Kanaya |
| 9,166,154 B2 | 10/2015 | Satoh et al. |

(Continued)

FOREIGN PATENT DOCUMENTS

| CN | 107667437 A | 2/2018 |
| CN | 110010759 A | 7/2019 |

OTHER PUBLICATIONS

International Search Report and Written Opinion dated Dec. 9, 2020 received in International Application No. PCT/IB2020/057828, 9 pages.

*Primary Examiner* — Yasser A Abdelaziez
(74) *Attorney, Agent, or Firm* — Scully, Scott, Murphy & Presser, P.C.; Daniel P. Morris, Esq.

(57) ABSTRACT

A dielectric material structure is formed laterally adjacent to a bottom portion of a bottom electrode metal-containing portion that extends upward from an electrically conductive structure that is embedded in an interconnect dielectric material layer. The physically exposed top portion of the bottom electrode metal-containing portion is then trimmed to provide a bottom electrode of unitary construction (i.e., a single piece) that has a lower portion having a first diameter and an upper portion that has a second diameter that is greater than the first diameter. The presence of the dielectric material structure prevents tilting and/or bowing of the resultant bottom electrode. Thus, a stable bottom electrode is provided.

10 Claims, 8 Drawing Sheets

(56) References Cited

U.S. PATENT DOCUMENTS

| | | | |
|---|---|---|---|
| 9,391,267 B2 | 7/2016 | Shen et al. | |
| 9,583,535 B2 | 2/2017 | Ito | |
| 9,614,143 B2 | 4/2017 | Lu et al. | |
| 9,704,919 B1 | 7/2017 | Lu et al. | |
| 10,043,851 B1 | 8/2018 | Shen et al. | |
| 2011/0111532 A1* | 5/2011 | Ryu | H01L 45/06 |
| | | | 438/3 |
| 2014/0264664 A1 | 9/2014 | Abraham et al. | |
| 2015/0325622 A1* | 11/2015 | Zhang | H01L 43/08 |
| | | | 257/421 |
| 2018/0040814 A1* | 2/2018 | Park | H01L 27/228 |
| 2018/0350875 A1* | 12/2018 | Han | H01L 27/228 |
| 2019/0097124 A1* | 3/2019 | Lee | H01L 43/02 |
| 2019/0123264 A1* | 4/2019 | Chuang | H01L 43/02 |
| 2020/0343299 A1* | 10/2020 | Hsu | H01L 43/12 |
| 2020/0403032 A1* | 12/2020 | Dutta | H01L 43/02 |

* cited by examiner

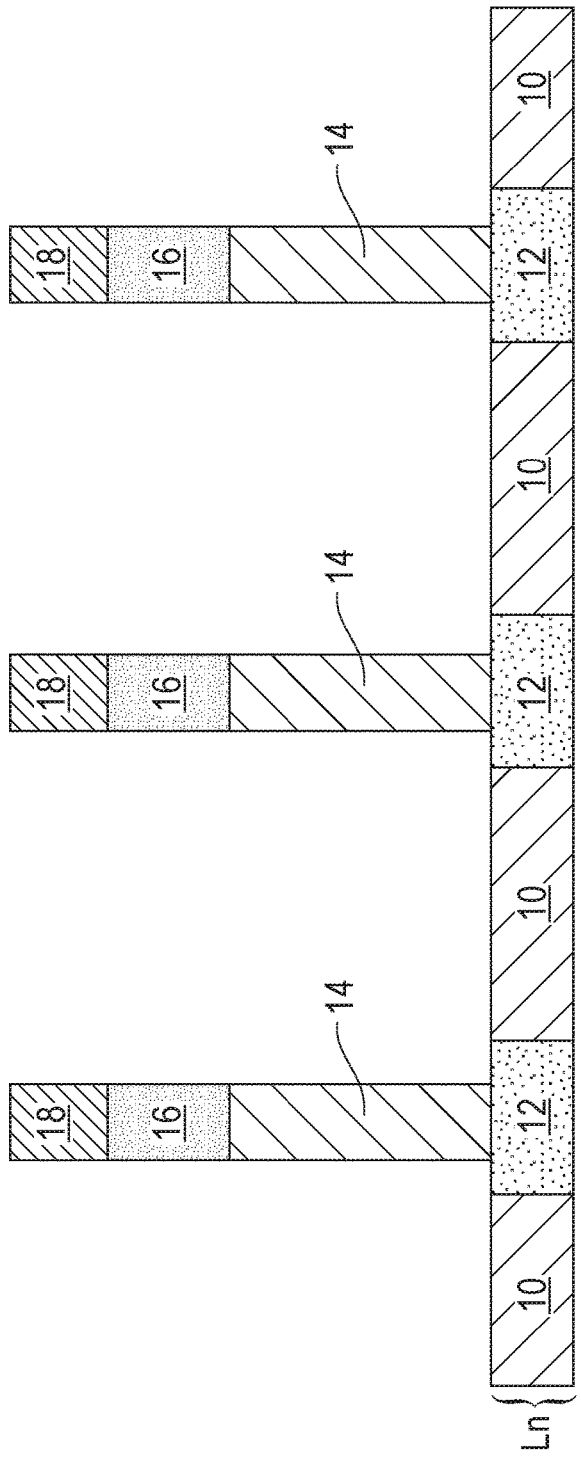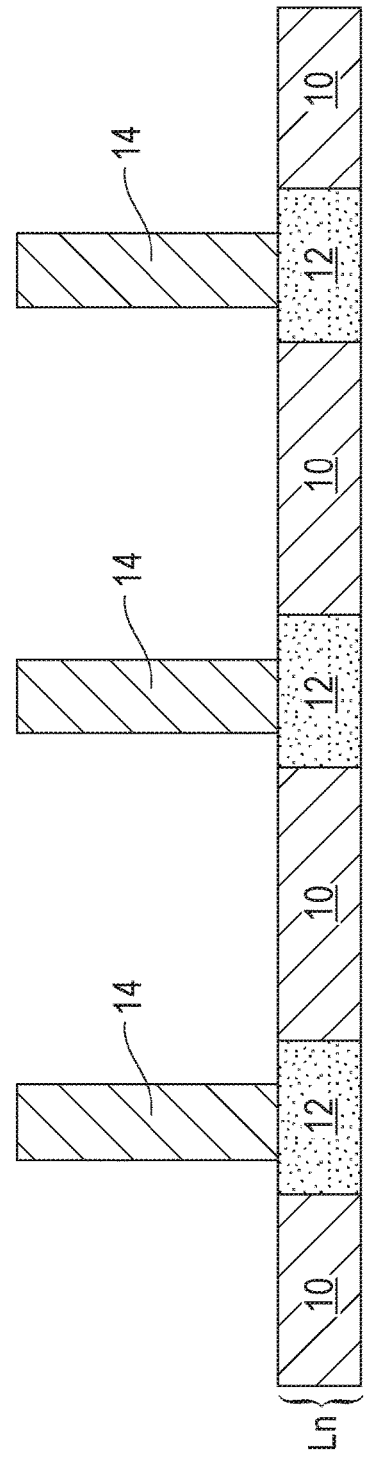
FIG. 4
FIG. 5

REINFORCED SINGLE ELEMENT BOTTOM ELECTRODE FOR MTJ-CONTAINING DEVICES

BACKGROUND

The present application relates to a memory structure and a method of forming the same. More particularly, the present application relates to a magnetoresistive random access memory (MRAM) structure that contains a stable bottom electrode which, in some embodiments, has a high aspect ratio.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates is a permanent magnet set to a particular polarity (i.e., a magnetic reference layer); the other plate's magnetization can be changed to match that of an external field to store memory (i.e., a magnetic free layer). Such a configuration is known as a magnetic tunnel junction (MTJ) pillar. In leading-edge or neuromorphic computing systems, a MTJ pillar is typically embedded within a back-end-of-the-line (BEOL) structure.

In the manufacturing of a MRAM device, blanket layers of MTJ pillar materials (i.e., a magnetic reference material, a tunnel barrier, a magnetic free material and a MTJ cap material) and a top electrode material are formed upon a bottom electrode of the MRAM device. The blanket layers are then patterned by lithography and etching to provide a material stack of a multilayered MTJ pillar (including remaining portions of the magnetic reference material, the tunnel barrier, the magnetic free material, and the MTJ cap material) and a top electrode located on the bottom electrode.

The size of the bottom electrode plays a significant role on array yield loss due to partial metallic shorts, especially when the MTJ pillar size is reduced to increase switching efficiency. The partial metallic shorts are caused by resputtered metallic particles that form on the MTJ pillar or surroundings during ion beam etching of a MTJ material stack.

Small bottom electrodes are key to yielding MTJ pillars with no sidewall residue. Ideally, the bottom electrode is well aligned with the MTJ pillar, and smaller than the MTJ pillar so that the bottom electrode is completely underneath the MTJ pillar. The bottom electrode also needs to be of a substantial height so that a sufficient dielectric thickness exists to allow for overetching of the MTJ material stack and cleaning of the MTJ pillar sidewall without reaching the underlying metal layers. For aggressively scaled MTJ pillars this results in a high aspect ratio bottom electrode feature (i.e., a height to diameter ratio of greater than 2 to 1). As the critical dimensions (CDs) approach 20 nm, the stability of the MTJ pillar is compromised and tilting and/or bowing of the bottom electrode is observed.

There is a need to provide a bottom electrode for use in a MRAM device containing a MTJ pillar in which the bottom electrode is stable (i.e., little or no tilting and/or bowing is observed).

SUMMARY

A dielectric material structure is formed laterally adjacent to a bottom portion of a bottom electrode metal-containing portion that extends upward from an electrically conductive structure that is embedded in an interconnect dielectric material layer. The physically exposed top portion of the bottom electrode metal-containing portion is then trimmed to provide a bottom electrode of unitary construction (i.e., a single piece) that has a lower portion having a first diameter and an upper portion that has a second diameter that is greater than the first diameter. In some embodiments, the bottom electrode has a high aspect ratio that is greater than 2 to 1. The presence of the dielectric material structure prevents tilting and/or bowing of the resultant bottom electrode. Thus, a stable bottom electrode is provided.

In one aspect of the present application, a memory structure is provided. In one embodiment, the memory structure includes a bottom electrode of unitary construction located on a surface of an electrically conductive structure that is embedded in a first interconnect dielectric material layer. In accordance with the present application, the bottom electrode has a bottom portion having a first diameter and a top portion having a second diameter that is less than the first diameter. The wider bottom portion of the bottom electrode provides stability to the entire bottom electrode. A dielectric material structure is located laterally adjacent to the bottom portion of the bottom electrode. A second interconnect dielectric material layer is located on the dielectric material structure and laterally adjacent to the upper portion of the bottom electrode. A magnetic tunnel junction (MTJ) pillar is located on a topmost surface of the upper portion of the bottom electrode, and a top electrode is located on the MTJ pillar.

In some embodiments, the bottom portion of the bottom electrode has a first height, and the top portion of the bottom electrode has a second height that is equal to, or greater than, the first height. In some embodiments, the first height is substantially equal to a height of the dielectric material structure, and the topmost surface of the upper portion of the bottom electrode is coplanar with a topmost surface of the second interconnect dielectric material layer. In some embodiments, the bottom electrode has a high aspect ratio that is greater than 2:1.

In some embodiments, the dielectric material structure is compositionally different from the first interconnect dielectric material layer and the second interconnect dielectric material layer. In some embodiments, the MTJ pillar is composed of a top pinned MTJ material stack. In other embodiments, the MTJ pillar is composed of a bottom pinned MTJ material stack. In some embodiments, the MTJ pillar and the top electrode have a same critical dimension, and the critical dimension of the MTJ pillar and the top electrode is larger than a critical dimension of the top portion of the bottom electrode.

In some embodiments, the memory structure further includes an encapsulation liner and a third interconnect dielectric material layer laterally adjacent to the MTJ pillar and the top electrode, wherein the encapsulation liner contacts sidewalls of both the MTJ pillar and the top electrode and the third interconnect dielectric material layer is located on the encapsulation liner.

In another aspect of the present application, a method of forming a memory structure is provided. In one embodiment, the method includes forming a bottom electrode metal-containing portion on a surface of an electrically conductive structure that is embedded in a first interconnect dielectric material layer of an interconnect level. Next, a non-conformal dielectric material layer is formed on the interconnect level and surrounding the bottom electrode metal-containing portion. An ion beam etch is thereafter performed to trim an upper portion of the bottom electrode metal-containing portion and to provide a bottom electrode that has a lower portion having a first diameter, and an upper portion having a second diameter that is less than the first diameter. In accordance with the present application, and during the ion beam etch, the non-conformal dielectric material layer that is located along the sidewall of the bottom electrode metal-containing portion is removed, while maintaining a portion of the non-conformal dielectric material layer adjacent to a bottom portion of the bottom electrode metal-containing portion.

In another embodiment of the present application, the method includes forming a bottom electrode metal-containing portion on a surface of an electrically conductive structure that is embedded in a first interconnect dielectric material layer of an interconnect level. Next, a dielectric material layer is formed on the interconnect level and laterally adjacent to, and above, the bottom electrode metal-containing portion. The dielectric material layer is thereafter recessed below a topmost surface of the bottom electrode metal-containing portion to physically expose an upper portion of the bottom electrode metal-containing portion. Next, the physically exposed upper portion of the bottom electrode metal-containing portion is trimmed to provide a bottom electrode that has a lower portion having a first diameter, and an upper portion having a second diameter that is less than the first diameter. In some embodiments, the trimming can include ion beam etching. In other embodiments, the trimming can include reactive ion etching, followed by a non-directional etch.

In each of the method embodiments, and by protecting the lower portion of the bottom electrode metal-containing portion during the trimming of the top portion of the bottom electrode metal-containing portion, the instability issue that leads to tilting and/or bowing of a bottom electrode has been mitigated and in some instanced entirely eliminated.

BRIEF DESCRIPTION OF THE DRAWINGS

FIG. 4 is a cross sectional view of the exemplary structure of FIG. 3 after patterning the dielectric hard mask layer and the bottom electrode metal-containing layer using a reactive ion etch and the patterned masks as etch masks to provide a plurality of first patterned material stacks, each first patterned material stack includes a dielectric hard mask material portion and a bottom electrode metal-containing portion.

FIG. 5 is a cross sectional view of the exemplary structure of FIG. 4 after removing each patterned mask and each dielectric hard mask material portion to physically expose a topmost surface of each bottom electrode metal-containing portion.

DETAILED DESCRIPTION

Figure 1:
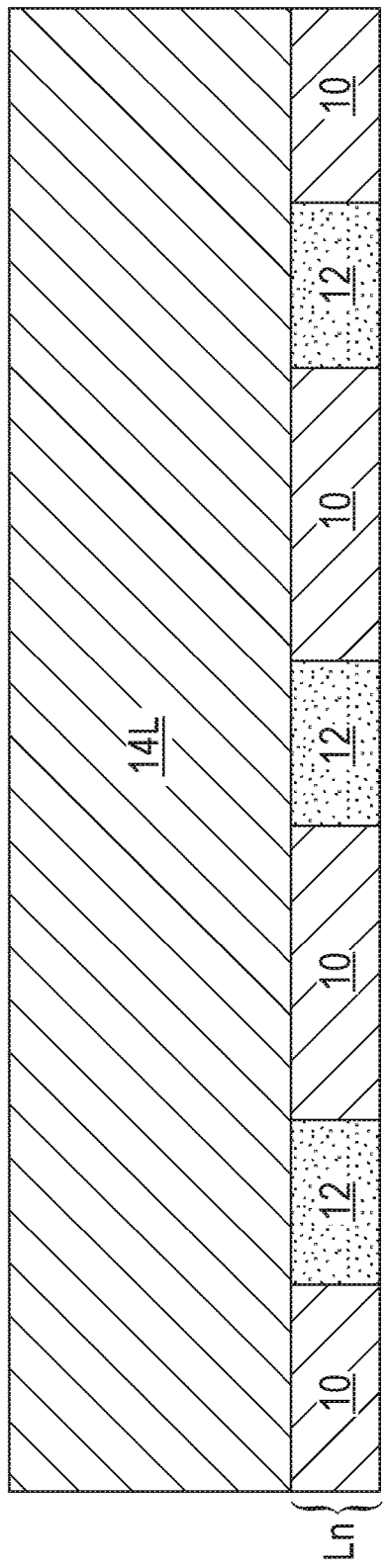
FIG. 1 is a cross sectional view of an exemplary structure that can be employed in accordance with an embodiment of the present application, wherein the exemplary structure includes a bottom electrode metal-containing layer located on a surface of an interconnect level that includes electrically conductive structures embedded in a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is noted that the drawings of the present application illustrate a memory device area in which a memory structure such as, for example, a MRAM, will be formed. A non-memory device area may be located laterally adjacent to the memory device area illustrated in the drawings of the present application. It is further noted that although the present application describes and illustrates forming a plurality of bottom electrodes for a memory array, the present application contemplates embodiments in which a single bottom electrode for a single memory structure is formed.

Referring first to FIG. 1, there is illustrated an exemplary structure that can be employed in accordance with an embodiment of the present application. The exemplary structure of FIG. 1 includes a bottom electrode metal-containing layer 14L located on a surface of an interconnect level, $L_n$, that includes electrically conductive structures 12 embedded in a first interconnect dielectric material layer 10.

Although not illustrated in the drawings, a metal level can be located beneath interconnect level, $L_n$. In some embodiments, and when n is 1, the metal level is a middle-of-the-line (MOL) level. In other embodiments, and when n is 2, 3, 4, etc, the metal level is a lower interconnect level that is positioned beneath interconnect level, $L_n$. In either embodiment, the metal level includes a dielectric material layer that contains at least one metal level electrically conductive structure embedded therein that is connected, either directly or indirectly, to an underlying CMOS device (not shown) that is present in a front-end-of-the-line (FEOL) level (also not shown).

When n is 1, the dielectric material layer of the metal level can be composed of a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants expressed herein are measured in a vacuum). Also, and in such an embodiment (i.e., when n is 1), the at least one metal level electrically conductive structure is a contact structure that includes a contact metal or a contact metal alloy such as, for example, tungsten (W), cobalt (Co), platinum (Pt), nickel (Ni) or alloys thereof.

When n is greater than 1, the dielectric material layer of the metal level can be composed of an interconnect dielectric material such as, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Also, and in such an embodiment (i.e., when n is greater than 1), the at least one metal level electrically conductive structure is composed of an electrically conductive metal or an electrically conductive metal alloy. Examples of electrically conductive materials that can be used in the present application include copper (Cu), aluminum (Al), or tungsten (W), while an example of an electrically conductive metal alloy is a Cu—Al alloy.

The first interconnect dielectric material layer 10 of interconnect level, $L_n$, can be composed of one of the interconnect dielectric materials mentioned above for dielectric material layer of the metal level. The electrically conductive structures 12 that are embedded in the first interconnect dielectric material layer 10 can be composed of one of the electrically conductive metals or metal alloys mentioned above for the at least one metal level electrically conductive structure.

In some embodiments, a diffusion barrier liner (not shown) is formed along the sidewall and a bottom wall of the electrically conductive structure 12. In some embodiments and as illustrated in FIG. 1, no diffusion barrier liner(s) is(are) present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN.

The metal level and interconnect level, $L_n$, can be formed utilizing conventional processes that are well-known to those skilled in the art. So as to not obscure the method of the present application, the techniques used to form the metal level and interconnect level, $L_n$, are not provided herein. In one embodiment, a damascene process can be used in forming both the metal level and interconnect level, $L_n$. A damascene process can include forming an opening into a dielectric material, filling the opening with a either a contact-metal containing material or an electrically conductive metal-containing material and, if needed, performing a planarization process such as, for example, chemical mechanical polishing (CMP) and/or grinding. In some embodiments, each electrically conductive structure 12 has a topmost surface that is coplanar with a topmost surface of the first interconnect dielectric material layer 10.

After forming interconnect level, $L_n$, the bottom electrode metal-containing layer 14L is formed on the interconnect level, $L_n$. As is illustrated in FIG. 1, the bottom electrode metal-containing layer 14L is formed on the first interconnect dielectric material layer 10 as well as on each electrically conductive structure 12. The bottom electrode metal-containing layer 14L can be composed of a single conductive material such as, for example, Ta, TaN, Ti, TiN, Ru, RuN, RuTa, RuTaN, Co, CoWP, CoN, W or WN. The bottom electrode metal-containing layer 14L has a thickness from 100 nm to 300 nm. In one example, the bottom electrode metal-containing layer 14L is composed of Ru and has a thickness from 150 nm to 250 nm. The bottom electrode metal-containing layer 14L can be formed by a deposition process such as, for example, sputtering, chemical vapor deposition (CVD), or plasma enhanced chemical vapor deposition (PECVD).

Figure 2:
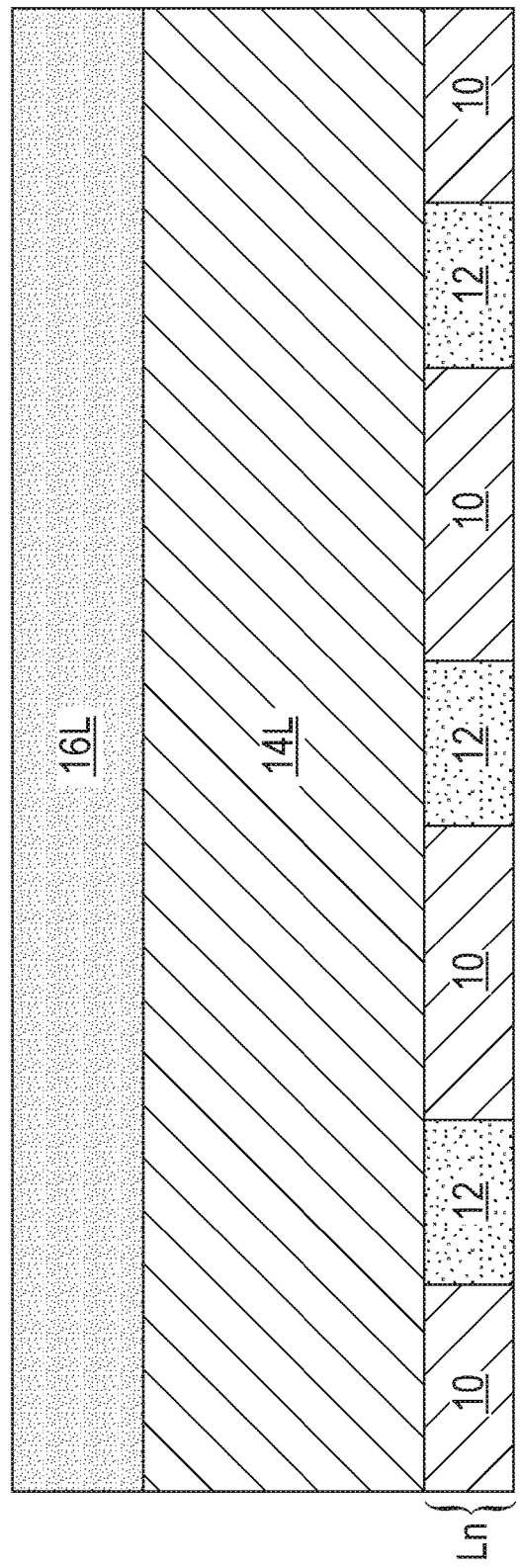
FIG. 2 is a cross sectional view of the exemplary structure of FIG. 1 after forming a dielectric hard mask layer on the bottom electrode metal-containing layer.

Referring now to FIG. 2, there is illustrated the exemplary structure of FIG. 1 after forming a dielectric hard mask layer 16L on the bottom electrode metal-containing layer 14L. The dielectric hard mask layer 16L is a continuous layer that covers an entirety of the bottom electrode metal-containing layer 14L. The dielectric hard mask layer 16L is composed of a dielectric hard mask material including, for example, silicon dioxide, silicon oxynitride, silicon nitride, or any combination thereof.

In some embodiments, the dielectric hard mask layer 16L can be formed utilizing a deposition process such as, for example, chemical vapor deposition (CVD), or plasma enhanced chemical vapor deposition (PECVD). The dielectric hard mask layer 16L can have a thickness from 50 nm to 150 nm; although other thicknesses for the dielectric hard mask layer 16L are contemplated and can be used in the present application.

Figure 3:
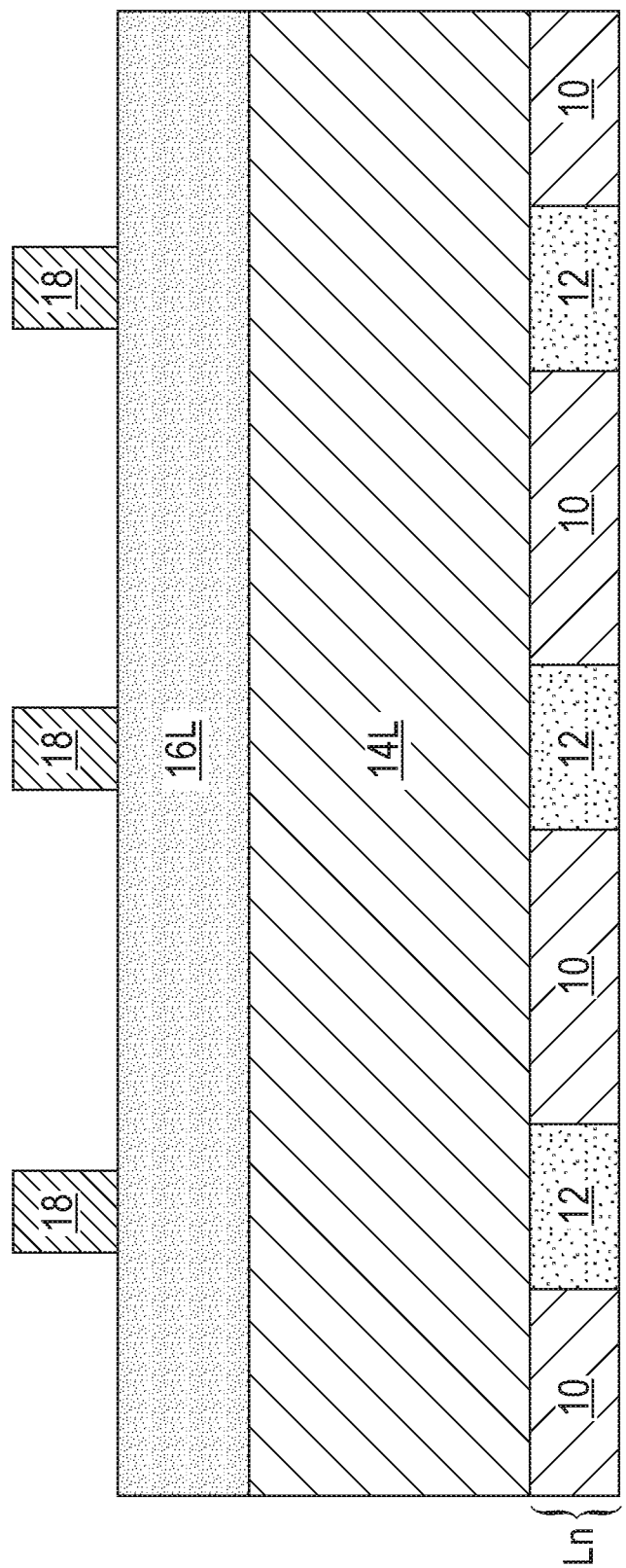
FIG. 3 is a cross sectional view of the exemplary structure of FIG. 2 after forming a plurality of patterned masks on the dielectric hard mask layer, wherein each patterned mask is located above one of the electrically conductive structures embedded in the interconnect dielectric material layer.

Referring now to FIG. 3, there is illustrated the exemplary structure of FIG. 2 after forming a plurality of patterned masks 18 on the dielectric hard mask layer 16L, wherein each patterned mask 18 is located above one of the electrically conductive structures 12 embedded in the first interconnect dielectric material layer 10. Each patterned mask 18 is spaced apart from a neighboring mask and is composed of a photoresist material such as, for example, a positive-tone photoresist material, a negative-tone photoresist material or a hybrid-tone photoresist material.

Each patterned mask 18 can be formed by lithography. Lithography includes applying a photoresist material to a material or material stack that needs to be patterned, exposing the photoresist material to a desired pattern of irradiation and developing the exposed photoresist material utilizing a conventional resist developer. The photoresist material may be applied utilizing a deposition process such as, for example, chemical vapor deposition (CVD), plasma enhanced chemical vapor deposition (PECVD) or spin-on coating.

Referring now to FIG. 4, there is illustrated the exemplary structure of FIG. 3 after patterning the dielectric hard mask layer 16L and the bottom electrode metal-containing layer 14L using a reactive ion etch (RIE) and the patterned masks 18 as etch masks to provide a plurality of first patterned material stacks, each first patterned material stack includes a dielectric hard mask material portion 16 and a bottom electrode metal-containing portion 14. Each bottom electrode metal-containing portion 14 extends vertically upwards from one of the underlying electrically conductive structures 12.

The dielectric hard mask material portion 16 of each first patterned material stack is composed of a remaining (i.e., non-etched) portion of the dielectric hard mask layer 16L, while the bottom electrode metal-containing portion 14 is composed of a remaining (i.e., non-etched) portion of the bottom electrode metal-containing layer 14L. The outermost sidewall of the dielectric hard mask material portion 16 is vertically aligned to the outermost sidewall of the bottom electrode metal-containing portion 14.

Each first patterned material stack (14/16) contacts a surface of one of the underlying electrically conductive structures 12 that is embedded in the first interconnect dielectric material layer 10. In some embodiments, each first patterned material stack (14/16) has a width (i.e., diameter) that is equal to, or less than, a width (i.e., diameter) of the underlying electrically conductive structure 12. Each first patterned material stack (14/16) can be cylindrical in shape; although other asymmetric shapes are possible and can be used in the present application as the shape of each first patterned material stack (14/16).

Referring now to FIG. 5, there is illustrated the exemplary structure of FIG. 4 after removing each patterned mask 18 and each dielectric hard mask material portion 16 to physically expose a topmost surface of each bottom electrode metal-containing portion 14. Each physically exposed bottom electrode metal-containing portion 14 is spaced apart from a neighboring bottom electrode metal-containing portion 14.

In some embodiments, the removal of each patterned mask 18 and each dielectric hard mask material portion 16 may be performed using a single material removal process. For example, a planarization process such as, for example, chemical mechanical polishing (CMP) or grinding can be used to simultaneously remove each patterned mask 18 and each dielectric hard mask material portion 16. In other embodiments, the removal of each patterned mask 18 is performed utilizing a first material removal process, and the removal of each dielectric hard mask material portion 16 is performed utilizing a second material removal process that differs from the first material removal process. In one example, the first material removal includes chemical etching, and the second material removal process includes CMP or grinding.

Figure 6:
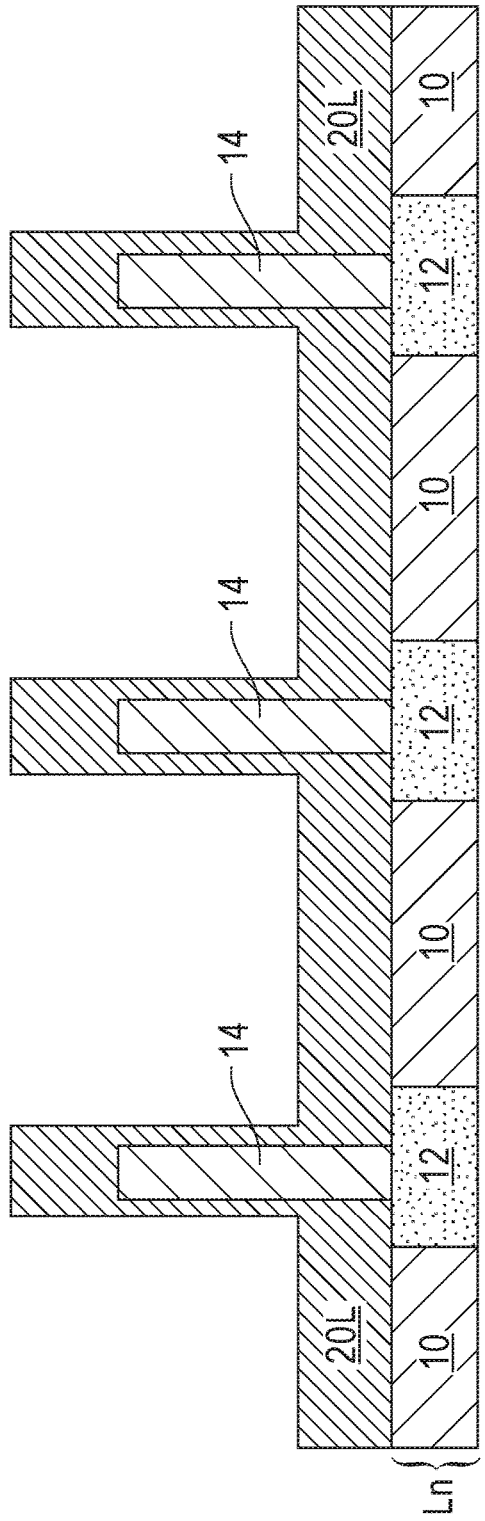
FIG. 6 is a cross sectional view of the exemplary structure of FIG. 5 after forming a non-conformal dielectric material layer on the interconnect level and surrounding each bottom electrode metal-containing portion.

Referring now to FIG. 6, there is illustrated the exemplary structure of FIG. 5 after forming a non-conformal dielectric material layer 20L on the interconnect level, $L_n$, and surrounding each bottom electrode metal-containing portion 14. By "non-conformal" it is meant that a material has a thickness along horizontal surfaces that is greater than along vertical surfaces.

The non-conformal dielectric material layer 20L is composed of a dielectric material such as, for example, silicon nitride or silicon oxynitride. The non-conformal dielectric material layer 20L can be formed utilizing a non-conformal deposition process such as, for example, a plasma deposition process or a chemical vapor deposition.

Figure 7:
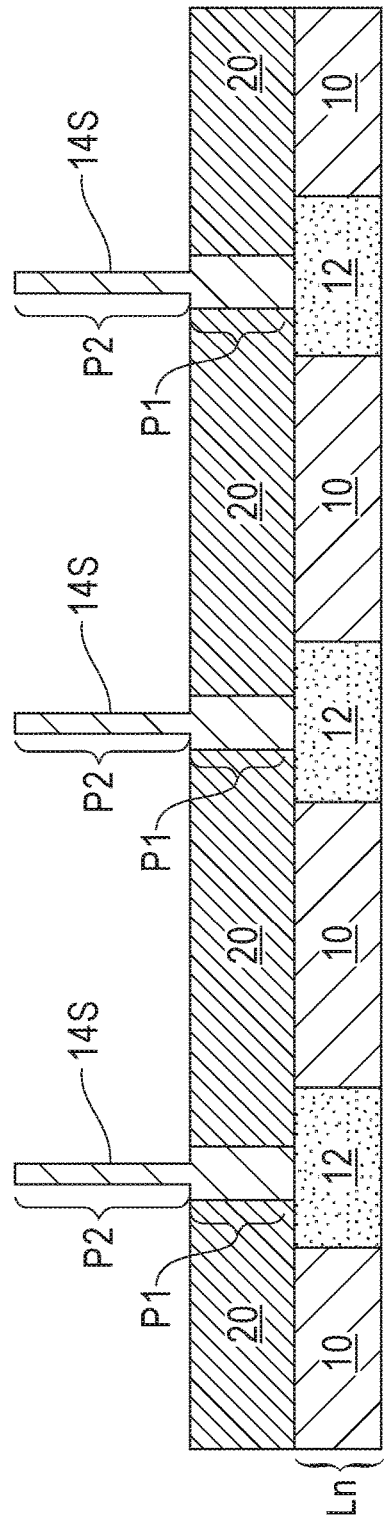
FIG. 7 is a cross sectional view of the exemplary structure of FIG. 6 after performing an ion beam etch to trim an upper portion of each bottom electrode metal-containing portion and to provide a bottom electrode that has a lower portion having a first diameter, and an upper portion having a second diameter that is less than the first diameter.

Referring now to FIG. 7, there is illustrated the exemplary structure of FIG. 6 after performing an ion beam etch (IBE) to trim (via ion beam etching) an upper portion of each bottom electrode metal-containing portion 14 and to provide a bottom electrode 14S that has a lower portion, P1, having a first diameter, and an upper portion, P2, having a second diameter that is less than the first diameter. Following the ion beam etching, any portion of the non-conformal dielectric material layer that remains on the topmost surface of the upper portion, P2, of each bottom electrode 14S can be removed utilizing a planarization process such as, for example, CMP or grinding.

In this trimming step of the present application, an ion beam is directed at a slight angle (from 65° to 80°) relative to the vertical sidewall of each bottom electrode metal-containing portion 14 such that the non-conformal dielectric material layer 20L that is present along the vertical sidewall of each bottom electrode metal-containing portion 14 is first removed to physically expose the sidewall of each bottom electrode metal-containing portion 14. The ion beam can be rotated around each bottom electrode metal-containing portion 14 to affect the trimming of the upper portion of each bottom electrode metal-containing portion 14. The ion beam etching continues to trim the dimension of physically exposed upper portion of each bottom electrode metal-containing portion 14. The lower portion of each bottom electrode metal-containing portion 14 is not trimmed during the ion beam etching due to the thicker portion of the non-conformal dielectric material layer 20L. The non-conformal dielectric material layer 20L that remains laterally adjacent to the lower portion, P2, of each bottom electrode 14S after ion beam etching can be referred to as dielectric material structure 20. By protecting the lower portion of each bottom electrode metal-containing portion 14 during the ion beam etch, the instability issue that leads to tilting and/or bowing of a bottom electrode has been mitigated and in some instances entirely eliminated.

Each bottom electrode 14S may be cylindrical in shape; although other asymmetric shapes are possible and can be used in the present application as the shape of each bottom electrode 14S. The lower portion, P1, of each bottom electrode 14S can be referred to a base portion, while the upper portion, P2, of each bottom electrode 14S which is present on the lower portion of the bottom electrode 14S may be referred to a vertical extending portion.

In one embodiment of the present application, the first diameter of the lower portion, P1, of each bottom electrode 14S can be from 5 nm to 200 nm, while the second diameter of the upper portion, P2, of each bottom electrode 14S can be from 1 nm to 150 nm.

In the present application, the lower portion, P1, of each bottom electrode 14S has a first height, while the upper portion, P2, of each bottom electrode 14S has a second height. The second height may be equal to, or greater than, the first height. In some embodiments, the first height of the lower portion, P1, of each bottom electrode 14S is from 5 nm to 100 nm, while the second height of the upper portion, P2, of each bottom electrode 14S is from 15 nm to 200 nm. The first height of the bottom portion, P1, of each bottom electrode 14S is substantially the same (within 10%) of the height of the dielectric material structure 20.

Each bottom electrode 14S is of unitary construction (i.e., a single piece) and is composed of a single conductive material, as defined above for the bottom electrode metal-containing layer 14. Each bottom electrode 14S is reinforced due to the presence of the dielectric material structure 20. Each bottom electrode 14S has an inverted T-shape with the lower portion, P1, having a dimension greater than the upper portion, P2. The bottom portion, P1, of each bottom electrode 14S forms an interface with one of the underlying electrically conductive structures 12.

Each bottom electrode 14S typically has a high aspect ratio. By 'high aspect ratio' it is meant that the bottom electrode 14S has height to diameter ratio of greater than 2 to 1 (the height is the first height plus the second height of the bottom electrode 14S, while the diameter is determined from the diameter of the lower portion, P1, of each bottom electrode 14S). In one example, each bottom electrode has an aspect ratio from 4:1 to 100:1. In some embodiments, each bottom electrode 14S has an aspect ratio that is 2 to 1 or less (i.e., 1 to 1).

Figure 8:
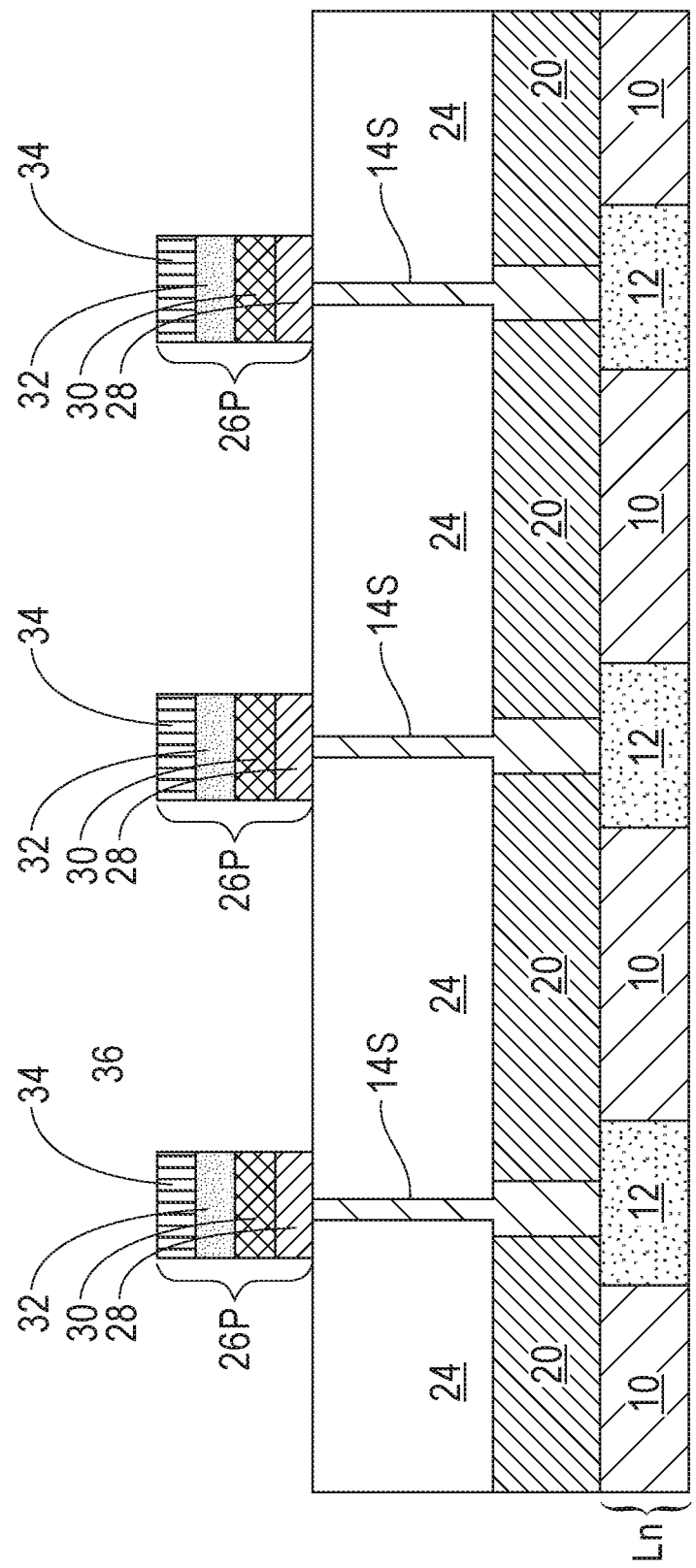
FIG. 8 is a cross sectional view of the exemplary structure of FIG. 7 after forming a second interconnect dielectric material layer laterally adjacent to the upper portion of each bottom electrode, and forming a plurality of second patterned material stacks on the second interconnect dielectric material layer, wherein each second patterned material stack contacts a topmost surface of the upper portion of one of the underlying bottom electrodes and includes a magnetic tunnel junction (MTJ) pillar and a top electrode.

Referring now to FIG. 8, there is illustrated the exemplary structure of FIG. 7 after forming a second interconnect dielectric material layer 24 laterally adjacent to the upper portion, P2, of each bottom electrode 14S, and forming a plurality of second patterned material stacks on the second interconnect dielectric material layer 24, wherein each second patterned material stack contacts a topmost surface of the upper portion, P2, of one of the underlying bottom electrodes 14S and includes a magnetic tunnel junction (MTJ) pillar 26P and a top electrode 34. It is observed that FIG. 8 and FIG. 9 to follow illustrate one exemplary process flow to from a MTJ pillar and a top electrode on the bottom electrode 14S of the present application.

The second interconnect dielectric material layer 24, which is formed on the dielectric material structure 20, can be composed of one of the interconnect dielectric materials mentioned above for the first interconnect dielectric material layer 10. The interconnect dielectric material that provides the second interconnect dielectric material layer 24 is compositionally different from the dielectric material structure 20. In one embodiment, the second interconnect dielectric material layer 24 is composed of an interconnect dielectric material that is compositionally the same as the interconnect dielectric material that provides the first interconnect dielectric material layer 10. In another embodiment, the second interconnect dielectric material layer 24 is composed of an interconnect dielectric material that is compositionally different from the interconnect dielectric material that provides the first interconnect dielectric material layer 10. The second interconnect dielectric material layer 24 can be formed utilizing one of the deposition processes mentioned above for forming the first interconnect dielectric material layer 10. A planarization process such as, for example, CMP, may follow the deposition of the interconnect dielectric material that provides the second interconnect dielectric material layer 24. The second interconnect dielectric material layer 24 has a topmost surface that is coplanar with a topmost surface of the upper portion, P2, of each bottom electrode 14S.

After forming the second interconnect dielectric material layer 24, a MTJ material stack (not show) and a top electrode metal-containing layer (not shown) are formed. The MTJ material stack can include at least a magnetic pinned layer, a tunnel barrier layer, and a magnetic free layer. In some embodiments, the MTJ material stack is a bottom pinned MTJ material stack that includes, from bottom to top, a magnetic pinned layer, a tunnel barrier layer, and a magnetic free layer. An optional metal seed layer (not shown) can also be present in the bottom pinned MTJ material stack. In the bottom pinned MTJ material stack, the optional metal seed layer is formed beneath the magnetic pinned layer. The bottom pinned MTJ material stack can also include a non-magnetic spacer layer (not shown) located on the magnetic free layer, a second magnetic free layer (not shown) located on the non-magnetic spacer layer, and/or a MTJ cap layer (not shown) located on the magnetic free layer or on the second magnetic free layer.

In other embodiments, the MTJ material stack is a top pinned MTJ material stack that includes, from bottom to top, a magnetic free layer, a tunnel barrier layer, and a magnetic pinned layer. In such an embodiment, the top pinned MTJ material stack can also include an optional metal seed layer located beneath the magnetic free layer, a non-magnetic spacer layer located on the magnetic free layer, a second magnetic free layer located on the non-magnetic spacer layer, and/or a MTJ cap layer located on the magnetic pinned layer.

The various material layers of the MTJ material stack can be formed by utilizing one or more deposition processes such as, for example, sputtering, plasma enhanced atomic layer deposition (PEALD), plasma enhanced chemical vapor deposition (PECVD) or physical vapor deposition (PVD).

The optional metal seed layer can be composed of platinum (Pt), palladium (Pd), nickel (Ni), rhodium (Rh), iridium (Jr), rhenium (Re) or alloys and multilayers thereof. In one example, the optional metal seed layer is composed of platinum (Pt).

The magnetic pinned layer has a fixed magnetization. The magnetic pinned layer can be composed of a metal or metal alloy (or a stack thereof) that includes one or more metals exhibiting high spin polarization. In alternative embodiments, exemplary metals for the formation of the magnetic pinned layer include iron, nickel, cobalt, chromium, boron, or manganese. Exemplary metal alloys can include the metals exemplified by the above. In another embodiment, the magnetic pinned layer can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the magnetic pinned layer.

The tunnel barrier layer is composed of an insulator material and is formed at such a thickness as to provide an appropriate tunneling resistance. Exemplary materials for the tunnel barrier layer include magnesium oxide, aluminum oxide, and titanium oxide, or materials of higher electrical tunnel conductance, such as semiconductors or low-bandgap insulators.

The magnetic free layer can be composed of a magnetic material (or a stack of magnetic materials) with a magnetization that can be changed in orientation relative to the magnetization orientation of the magnetic pinned layer. Exemplary magnetic materials for the magnetic free layer include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer can include one of the magnetic materials mentioned above for magnetic free layer. In one embodiment, the second magnetic free layer is composed of a same magnetic material as the magnetic free layer. In another embodiment, the second magnetic free layer is composed of a magnetic material that is compositionally different from the magnetic free layer.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer can have a thickness from 2 nm to 25 nm; other thicknesses are possible and can be used in the present application as the thickness of the MTJ cap layer.

The top electrode metal-containing layer can be composed of a conductive material such as, for example, Ta, TaN, Ti, TiN, Ru, RuN, RuTa, RuTaN, Co, CoWP, CoN, W, WN or any combination thereof. In one embodiment of the present application, top electrode metal-containing layer is composed of Ti/TiN. The conductive material that provides the top electrode metal-containing layer can be compositionally the same as, or compositionally different from, the conductive material that provides the bottom electrode metal-containing layer 14L.

In the present application, the top electrode metal-containing layer can have a thickness that is from 100 nm to 500 nm; although other thicknesses are possible and can be used as the thickness of the top electrode metal-containing layer. The top electrode metal-containing layer can be formed by a deposition process such as, for example, sputtering, plasma enhanced atomic layer deposition (PEALD), plasma enhanced chemical vapor deposition (PECVD) or physical vapor deposition (PVD).

Next, the top electrode metal-containing layer and the MTJ material stack are patterned to provide the plurality of second patterned material stacks. As mentioned above, each second patterned material stack includes magnetic tunnel junction (MTJ) pillar 26P and top electrode 34. MTJ pillar 26P includes a remaining (i.e., non-etched) portion of the MTJ material stack. The top electrode 34 includes a remaining (i.e., non-etched) portion of top electrode metal-containing layer.

The patterning of the top electrode metal-containing layer and the MTJ material stack can include first forming a patterned mask (not shown) on a physically exposed surface of the top electrode metal-containing layer. In some embodiments, the patterned mask can be composed of a photolithographic resist stack. In one embodiment, the photolithographic resist stack that provides the patterned mask can include a bottom organic layer, a middle inorganic layer and a top resist layer. The bottom organic layer of the photolithographic resist stack can include an organic planarization layer (OPL). The bottom organic layer of the photolithographic resist stack can include a spun-on organic layer such as, for example, a Near Frictionless Carbon (NFC), a diamond-like carbon, a thermosetting polyarylene ether or polyimide. The middle inorganic layer of the photolithographic resist stack can include any oxide layer such as, for example, a low temperature (e.g., less than or equal to 250° C.) CVD oxide, an oxide derived from TEOS (tetraethylorthosilicate), a silicon oxide, a silane oxide, or a Si-containing anti-reflection coating material (SiARC). The top resist layer of the photolithographic resist stack can be composed of a resist material that provides for high resolution lithography patterning. The photolithographic resist stack can be formed be first providing a utilizing a series of deposition processes including first spin-on coating of the bottom organic layer, second spin-on coating of the middle inorganic layer, and third spin-on coating of the top resist layer. After providing the photolithographic resist stack, the top resist layer is patterned by photolithography (i.e., exposing the top resist layer to a pattern of irradiation and then developing the exposed top resist layer), and thereafter the pattern provided to the top resist layer is transferred into the underlying layers of the photolithographic resist stack providing patterned mask. The transferring can include one or more etching processes.

In some embodiments, patterning can include first patterning the top electrode metal-containing layer utilizing a first etching process such as, for example, a reactive ion etch, utilizing the patterned mask as an etch mask. The remaining, i.e., non-patterned, portion of the top electrode metal-containing layer provides the top electrode 34. The top electrode 34 can be cylindrical in shape; although other asymmetric shapes are possible and can be used in the present application as the shape of the top electrode 34. The critical dimension (CD) of the top electrode 34 can vary and is not critical in the present application.

After patterning the top electrode metal-containing layer, the patterned mask is removed from atop the top electrode 34 that is formed utilizing conventional processes well-known to those skilled in the art. The patterning of the MTJ material stack is then performed utilizing an ion beam etch (IBE) in which the top electrode 34 is employed as a patterned mask. The remaining, i.e., non-patterned, portion of the MTJ material stack provides the MTJ pillar 26P. In one example and as shown in FIG. 8, each MTJ pillar 26P includes, from bottom to top, a magnetic pinned material layer portion 28 (i.e., a remaining, unetched portion of the magnetic pinned material layer), a tunnel barrier layer portion 30 (i.e., a remaining, unetched portion of the tunnel barrier layer), and a magnetic free layer portion 32 (i.e., a remaining, unetched portion of the magnetic free layer). In another example (not shown), each MTJ pillar 26P includes, from bottom to top, a magnetic free layer portion, a tunnel barrier layer portion, and a magnetic pinned material layer portion. The MTJ pillar 26P can include remaining portions of any other layer that is present in the MTJ material stack. The MTJ pillar 26P can be cylindrical in shape; although other asymmetric shapes are possible and can be used in the present application as the shape of the MTJ pillar 26P; the MTJ pillar 26P and the top electrode 34 have a same shape. The critical dimension (CD) of the MTJ pillar 26P can vary and is not critical in the present application. The CD of the MTJ pillar 26P is typically the same as the CD of the top electrode 34. As is shown, the CD of the MTJ pillar 26P and the CD of the top electrode 34 are greater than the CD of the underlying top portion, P2, of the bottom electrode 14S. Collectively, the bottom electrode 14S, the MTJ pillar 26P, and the top electrode 34 provide a memory structure in accordance with the present application.

Figure 9:
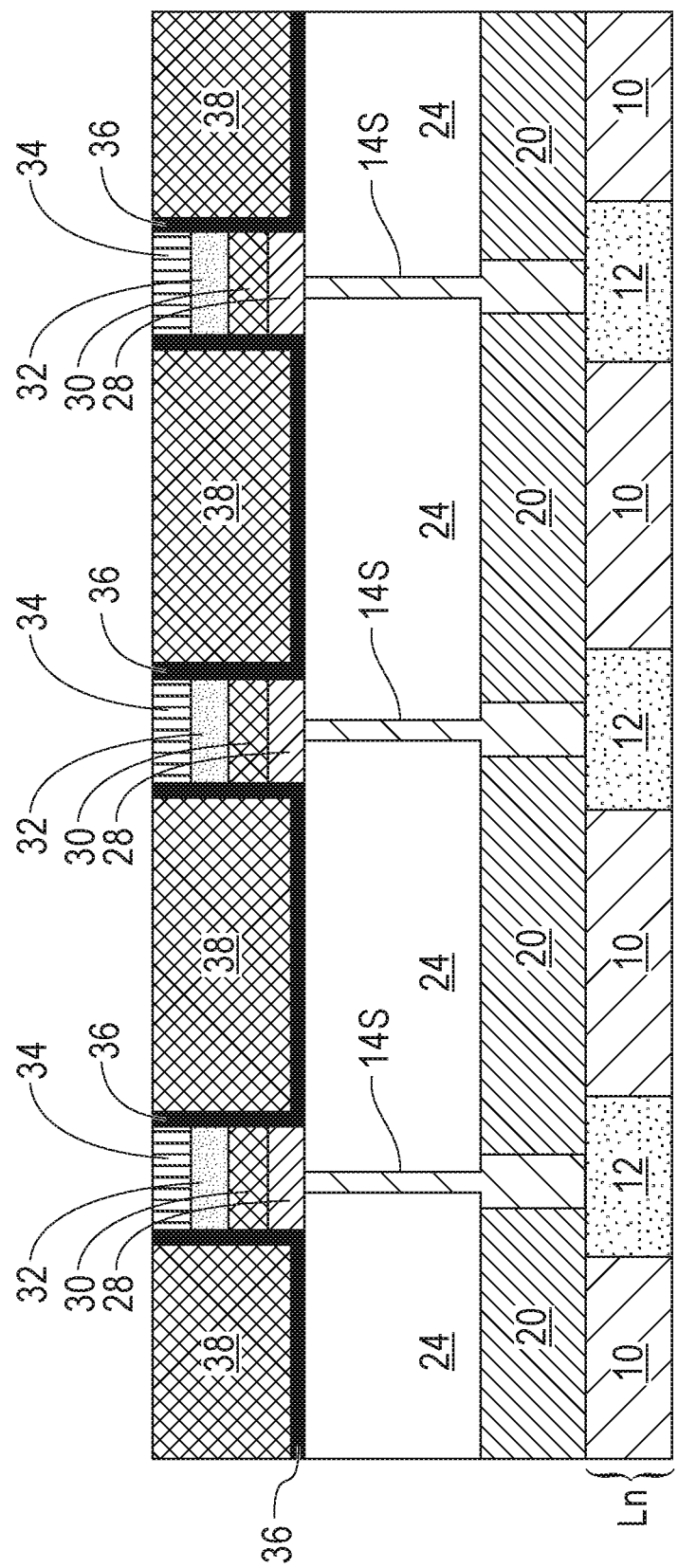
FIG. 9 is a cross sectional view of the exemplary structure of FIG. 8 after forming an encapsulation liner and a third interconnect dielectric material layer laterally adjacent to each second patterned material stack.

Referring now to FIG. 9, there is illustrated the exemplary structure of FIG. 8 after forming an encapsulation liner 36 and a third interconnect dielectric material layer 38 laterally adjacent to each second patterned material stack. The encapsulation liner 36 laterally surrounds the top electrode 34 and the MTJ pillar 26P. The third interconnect dielectric material layer 38 is located on the encapsulation liner 36 and fills in the gaps that are located between neighboring memory structures.

The encapsulation liner 36 is composed of a dielectric material that is compositionally different from the second interconnect dielectric material layer 24. The dielectric material that provides the encapsulation liner 36 may provide passivation to the top electrode 34 and the MTJ pillar 26P. In one embodiment, the encapsulation liner 36 is composed of silicon nitride. In another embodiment, the encapsulation liner 36 can be composed of a dielectric material that contains atoms of silicon, carbon and hydrogen. In some embodiments, and in addition to atoms of carbon and hydrogen, the dielectric material that provides the encapsulation liner 36 can include atoms of at least one of nitrogen and oxygen. In other embodiments, and in addition to atoms of silicon, nitrogen, carbon and hydrogen, the dielectric material that provides the encapsulation liner 36 can include atoms of boron. In one example, the encapsulation liner 36 can be composed of an nBLOK dielectric material that contains atoms of silicon, carbon, hydrogen, nitrogen and oxygen. In alternative example, the encapsulation liner 36 can be composed of a SiBCN dielectric material that contains atoms of silicon, boron, carbon, hydrogen, and nitrogen.

The encapsulation liner 36 can be formed by first deposition a continuous layer of the dielectric material that provides the encapsulation liner 36. During a subsequently performed planarization process that is used in forming the third interconnect dielectric material layer 38, the dielectric material that provides the encapsulation liner 36 is removed from a topmost surface of each of the top electrodes 34. The encapsulation liner 36 can have a thickness from 10 nm to 200 nm. Other thicknesses are possible and can be employed as the thickness of the encapsulation liner 36. The encapsulation liner 36 typically has a topmost surface that is coplanar with a topmost surface of the top electrodes 34.

The third interconnect dielectric material layer 38 can include one of the interconnect dielectric materials mentioned above. The interconnect dielectric material that provides the third interconnect dielectric material layer 38 can be compositionally the same as, or compositionally different from, the interconnect dielectric material that provides the first interconnect dielectric material layer 10 and/or the second interconnect dielectric material layer 24. The third interconnect dielectric material layer 38 can be formed utilizing a conventional deposition process including, for example, chemical vapor deposition (CVD), plasma enhanced chemical vapor deposition (PECVD) or spin-on coating. A planarization process such as, for example, chemical mechanical polishing (CMP), can follow the deposition of the interconnect dielectric material that provides the third interconnect dielectric material layer 38; as mentioned above this planarization steps also removes the dielectric material that provides the encapsulation liner 36 from the topmost surface of the top electrodes 34.

Figure 10:
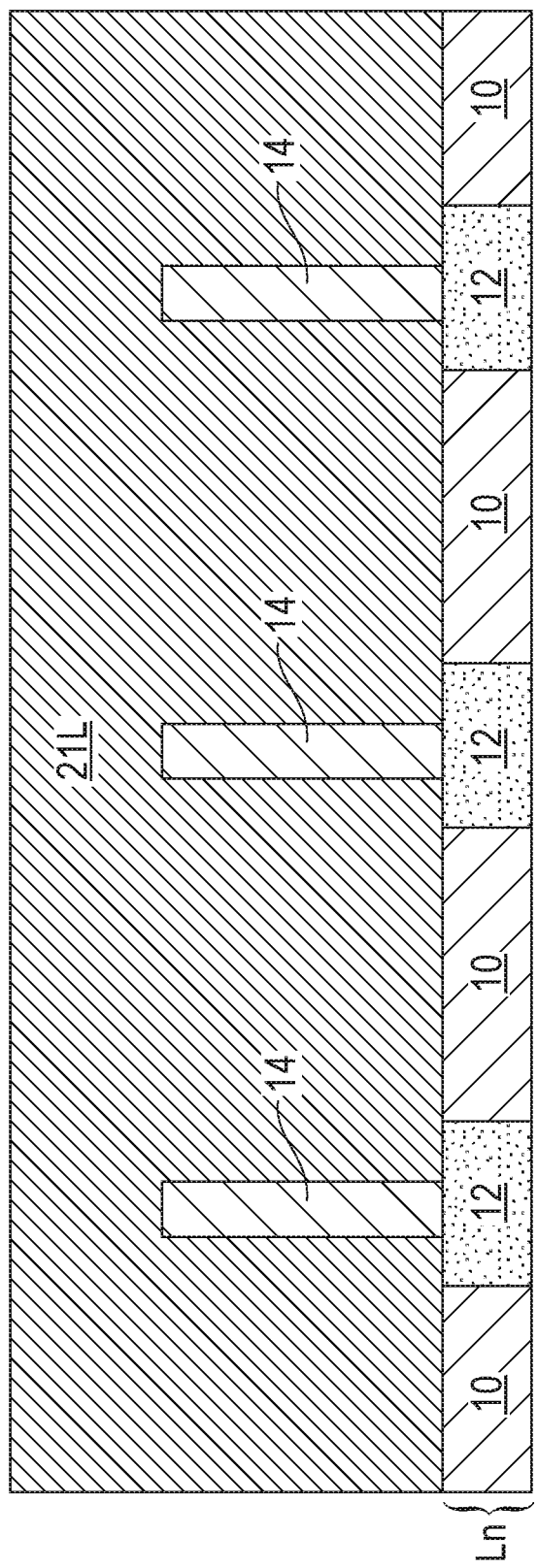
FIG. 10 is a cross sectional view of the exemplary structure of FIG. 5 after forming a dielectric material layer laterally adjacent to, and above, each bottom electrode metal-containing portion.
Figure 11:
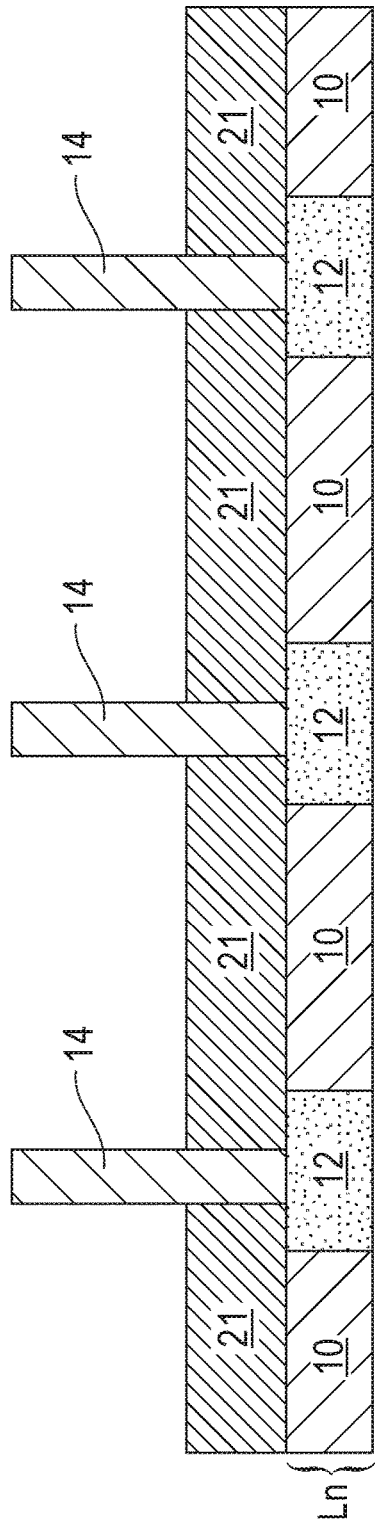
FIG. 11 is a cross sectional view of the exemplary structure of FIG. 10 after recessing the dielectric material layer below the topmost surface of each bottom electrode metal-containing portion to physically expose an upper portion of each bottom electrode metal-containing portion.
Figure 12:
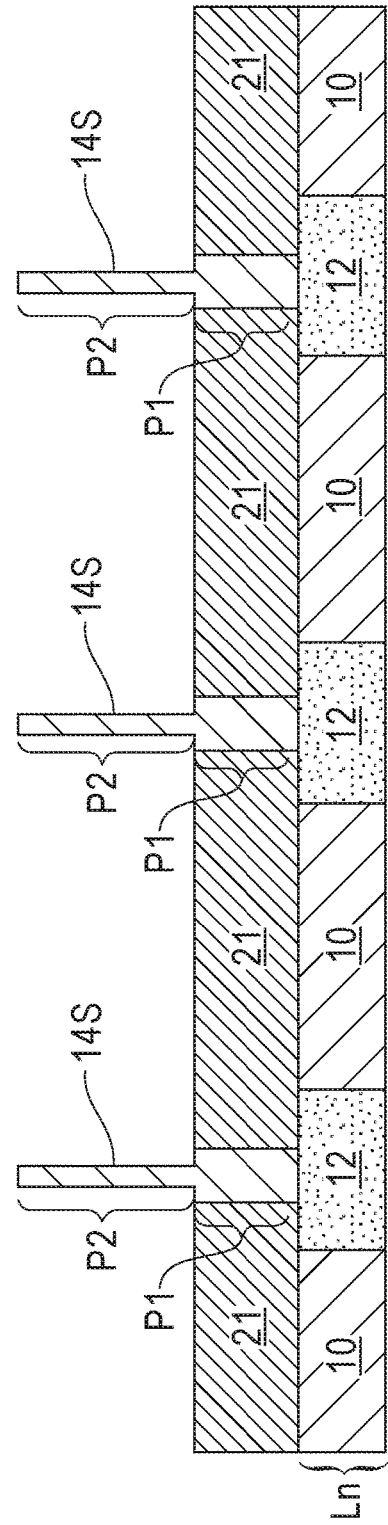
FIG. 12 is a cross sectional view of the exemplary structure of FIG. 11 after trimming the physically exposed upper portion of each bottom electrode metal-containing portion to provide a bottom electrode that has a lower portion having a first diameter, and an upper portion having a second diameter that is less than the first diameter.

Referring now to FIGS. 10, 11 and 12, there are illustrated an alternative embodiment that can be used to form a bottom electrode 14S in accordance with the present application. Notably, and referring first to FIG. 10, there is illustrated the exemplary structure of FIG. 5 after forming a dielectric material layer 21L laterally adjacent to, and above, each bottom electrode metal-containing portion 14.

Dielectric material layer 21L may be composed of a dielectric material such as, for example, silicon nitride or silicon oxynitride. The dielectric material that provides the dielectric material layer 21L is compositionally different from the first interconnect dielectric material layer 10. Dielectric material layer 21L can be formed utilizing a deposition process such as, for example, CVD, PECVD or PVD. The dielectric material layer 21L has a height that is greater than the height of each bottom electrode metal-containing portion 14 and an entirely fills in the space that is located laterally between each bottom electrode metal-containing portion 14.

Referring now to FIG. 11, there is illustrated the exemplary structure of FIG. 10 after recessing the dielectric material layer 21L below the topmost surface of each bottom electrode metal-containing portion 14 to physically expose an upper portion of each bottom electrode metal-containing portion 14. The recessing of the dielectric material layer 21L includes a recess etching process that is selective in removing the dielectric material that provides the dielectric material layer 21L as compared with the conductive material that provides the bottom electrode metal-containing portion 14. The dielectric material layer 21L that remains after the recess etch is referred to herein as dielectric material structure 21. Dielectric material structure 21 protects the lower portion of each bottom electrode metal-containing portion 14 during a subsequently performed trimming process.

Referring now to FIG. 12, there is illustrated the exemplary structure of FIG. 11 after trimming the physically exposed upper portion of each bottom electrode metal-containing portion 14 to provide a bottom electrode 14S that has a lower portion, P1, having a first diameter, and an upper portion, P2, having a second diameter that is less than the first diameter.

In this embodiment of the present application, trimming may be performed by ion beam etching as defined above, or by utilizing a combination of reactive ion etching and then a non-directional etch such as, for example, a wet etch. In either case, a reinforced bottom electrode 14S is formed. The bottom electrode 14S that is formed in this embodiment is the same as the bottom electrode 14S formed in the previous embodiment of the present application. Thus the specific details concerning the bottom electrode 14S including for example, the dimensions and heights of the lower portion, P1, and the upper portion P2, and the aspect ratio are the same here for this embodiment of the present application.

It is noted that by protecting the lower portion of each bottom electrode metal-containing portion 14 during the trimming of the top portion of each bottom electrode metal-containing portion 14, the instability issue that leads to tilting and/or bowing of a bottom electrode has been mitigated and in some instanced entirely eliminated.

At this point of the present application, the exemplary structure shown in FIG. 12 can be subjected to the processing shown in FIGS. 8 and 9 of the present application so that a MTJ pillar and a top electrode are formed over each of the bottom electrodes 14S of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
    a bottom electrode of unitary construction located on a surface of an electrically conductive structure that is embedded in a first interconnect dielectric material layer, wherein the bottom electrode has a bottom portion having a first diameter and a top portion having a second diameter that is less than the first diameter;
    a dielectric material structure located laterally adjacent to the bottom portion of the bottom electrode;
    a second interconnect dielectric material layer located on the dielectric material structure and laterally adjacent to the upper portion of the bottom electrode;
    wherein the dielectric material structure is compositionally different from the first interconnect dielectric material layer; and
    a magnetic tunnel junction (MTJ) pillar located on a topmost surface of the upper portion of the bottom electrode; and
    a top electrode located on the MTJ pillar.

2. The memory structure of claim 1, wherein the first diameter is from 5 nm to 200 nm, and the second diameter is from 1 nm to 150 nm.

3. The memory structure of claim 1, wherein the bottom portion of the bottom electrode has a first height, and the top portion of the bottom electrode has a second height that is equal to, or greater than, the first height.

4. The memory structure of claim 3, wherein the first height is substantially equal to a height of the dielectric material structure, and the topmost surface of the upper portion of the bottom electrode is coplanar with a topmost surface of the second interconnect dielectric material layer.

5. The memory structure of claim 1, wherein bottom electrode has an aspect ratio of greater than 2:1.

6. The memory structure of claim 1, wherein the dielectric material structure is compositionally different from the second interconnect dielectric material layer.

7. The memory structure of claim 1, wherein the MTJ pillar is composed of a top pinned MTJ material stack.

8. The memory structure of claim 1, wherein the MTJ pillar is composed of a bottom pinned MTJ material stack.

9. The memory structure of claim 1, wherein the MTJ pillar and the top electrode have a same critical dimension, and the critical dimension of the MTJ pillar and the top electrode is larger than a critical dimension of the top portion of the bottom electrode.

10. A memory structure comprising:
    a bottom electrode of unitary construction located on a surface of an electrically conductive structure that is embedded in a first interconnect dielectric material layer, wherein the bottom electrode has a bottom portion having a first diameter and a top portion having a second diameter that is less than the first diameter;
    a dielectric material structure located laterally adjacent to the bottom portion of the bottom electrode;
    a second interconnect dielectric material layer located on the dielectric material structure and laterally adjacent to the upper portion of the bottom electrode;
    a magnetic tunnel junction (MTJ) pillar located on a topmost surface of the upper portion of the bottom electrode;
    a top electrode located on the MTJ pillar; and
    an encapsulation liner and a third interconnect dielectric material layer laterally adjacent to the MTJ pillar and the top electrode, wherein the encapsulation liner contacts sidewalls of both the MTJ pillar and the top electrode and the third interconnect dielectric material layer is located on the encapsulation liner.

* * * * *